United States Patent [19]

Hasan et al.

[11] Patent Number: 5,646,441
[45] Date of Patent: Jul. 8, 1997

[54] TCP TAB DESIGN WITH RADIAL OUTER LEADS

[75] Inventors: Altaf Hasan, Chandler; J. D. Wilson; Tor Kalleberg, both of Phoenix, all of Ariz.

[73] Assignee: Intel Corporation, Santa Clara, Calif.

[21] Appl. No.: 631,600

[22] Filed: Apr. 18, 1996

Related U.S. Application Data

[63] Continuation of Ser. No. 255,247, Jun. 7, 1994, abandoned.
[51] Int. Cl.$^6$ .................................................. H01L 23/495
[52] U.S. Cl. ........................................ 257/666; 257/676
[58] Field of Search .................................. 428/131, 906; 257/668, 672, 666, 676, 670, 690, 787

[56] References Cited

U.S. PATENT DOCUMENTS 5,371,406  12/1994  Kojima et al. .......................... 257/787
5,440,452   8/1995  Kitahara .................................. 257/690

FOREIGN PATENT DOCUMENTS 3-94435  4/1991  Japan .................................. 252/672

*Primary Examiner*—Sara W. Crane
*Assistant Examiner*—Roy Potter
*Attorney, Agent, or Firm*—Blakely, Sokoloff, Taylor & Zafman

[57] ABSTRACT

An integrated circuit package which has a plurality of inner surface pads located on a substrate and arranged in an angular pattern about an integrated circuit. The inner surface pads of the package are coupled to the outer surface pads of the integrated circuit with a TAB tape. The TAB tape has a plurality of conductors which each have a first end attached to the outer pads of the integrated circuit and a land portion attached to the inner surface pads of the substrate. The land portions of the tape are also arranged in an angular pattern about the integrated circuit.

3 Claims, 4 Drawing Sheets

TCP TAB DESIGN WITH RADIAL OUTER LEADS

This is a continuation application of application Ser. No. 08/255,247, filed Jun. 07, 1994 now abandoned.

BACKGROUND OF THE INVENTION

1. Field of the Invention

The present invention relates to an integrated circuit package.

2. Description of Related Art

Integrated circuits are sometimes housed within a ceramic substrate that is sealed with a lid. The ceramic substrate typically has a plurality of outer surface leads/pins located on the bottom of the package. The outer surface leads are soldered/inserted to corresponding conductive features of a printed circuit board.

The outer leads/pin are coupled to inner surface pads located within an inner cavity of the ceramic substrate. The inner cavity also contains the integrated circuit which has a plurality of corresponding outer surface pads located on the top surface of the die. The outer pads of the die are coupled to the inner substrate surface pads by either TAB tape or conventional wire bonding techniques.

As shown in FIG. 1, integrated circuit dies 2 are typically rectangular in shape and have the outer surface pads 4 located along each edge of the die. The inner surface pads 6 of the substrate 8 are also located in a corresponding rectangular pattern about the integrated circuit.

Ceramic packages are typically constructed by attaching the surface pads and accompanying interconnective circuitry to an uncured ceramic material commonly referred to as "green tape". The tape and conductive material are then fired and cooled to create a hard ceramic substrate. Heating and cooling the ceramic and conductors induces an expansion and contraction of the two materials. The ceramic has a different coefficient of thermal expansion than the conductors so that each material grows and contracts at a different rate. Growth of the ceramic material originates at the center of the package and extends outward in a radial direction.

As shown in FIG. 2, the inner surface pads 6 may move to a different position during the firing process of the ceramic. The pad movement is somewhat unpredictable. Additional spacing between the pads must therefore be provided to compensate for the variations in pad position. This additional spacing limits the pitch of the pads. Additionally, any subsequent thermal expansion of the final assembled package will create a corresponding radial growth of the ceramic substrate and may induce shear stresses in the bond joint of the pads and bending moments of the bonding wires or TAB leads. It would be desirable to provide a package that provided a more accurate inner pad location and which reduced the stresses on the pad joints.

SUMMARY OF THE INVENTION

The present invention is an integrated circuit package which has a plurality of inner surface pads located on a substrate and arranged in an angular pattern about an integrated circuit. The inner surface pads of the package are coupled to the outer surface pads of the integrated circuit with a TAB tape. The TAB tape has a plurality of conductors which each have a first end attached to the outer pads of the integrated circuit and a land portion attached to the inner surface pads of the substrate. The land portions of the tape are also arranged in an angular pattern about the integrated circuit. The angular pattern of the inner surface pads of the substrate and the rand portions of the tape, provide an arrangement which maintains thermal expansion along the longitudinal axis of the pads. Longitudinal expansion reduces the lateral movement of the inner surface pads and increases the predictability of the pad locations.

BRIEF DESCRIPTION OF THE DRAWINGS

The objects and advantages of the present invention will become more readily apparent to those ordinarily skilled in the art after reviewing the following detailed description and accompanying drawings, wherein.

DETAILED DESCRIPTION OF THE INVENTION

Figure 1:
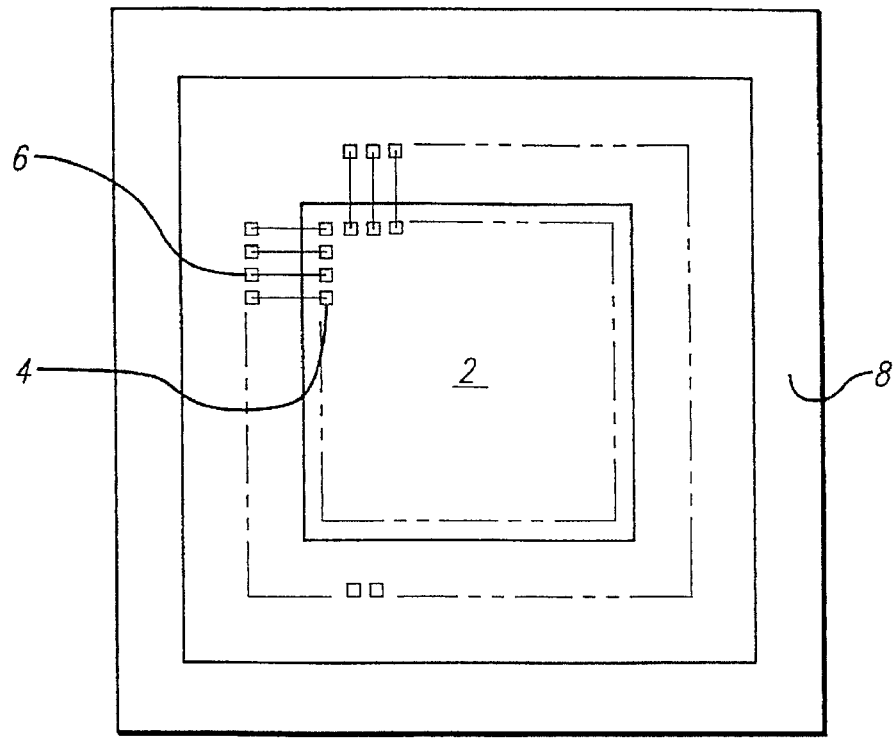
FIG. 1 is a top view of an integrated circuit mounted to a ceramic substrate of the prior art.
Figure 2:
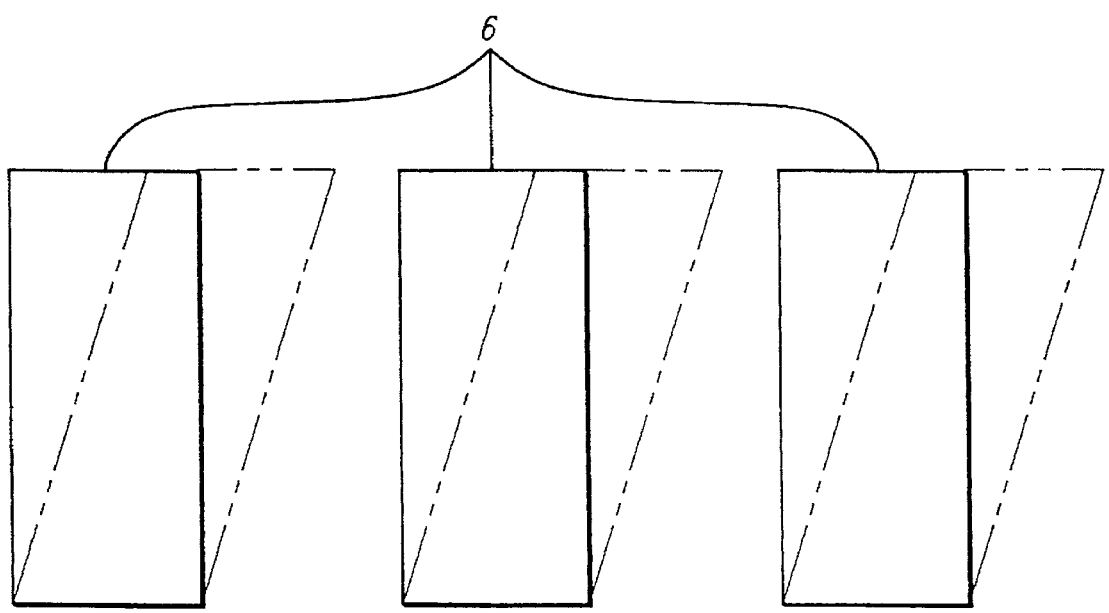
FIG. 2 is a top view showing the movement of inner surface pads after the ceramic substrate of FIG. 1 is fired.
Figure 3:
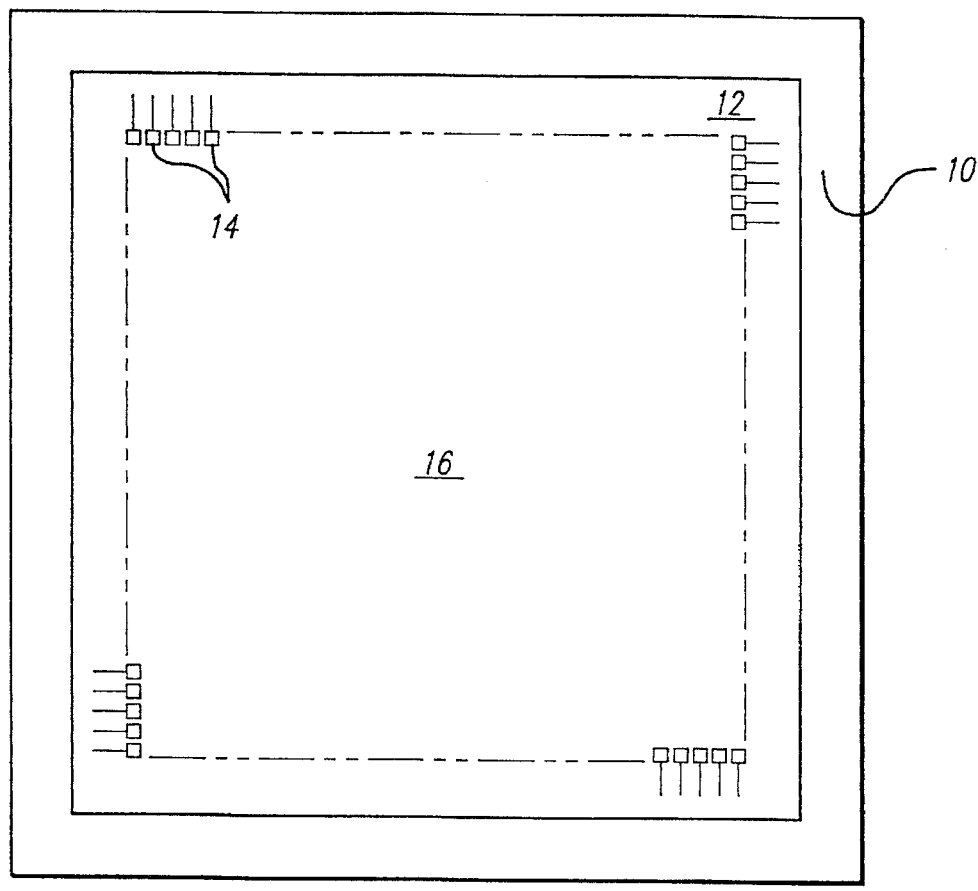
FIG. 3 is a top view showing a rectangular pattern of inner surface pads on a substrate of an integrated circuit package.

Referring to the drawing more particularly by reference numbers, FIG. 3 shows a substrate 10 of the present invention. The substrate 10 is used to form an integrated circuit package that houses an integrated circuit. The integrated circuit is typically located within an inner cavity 12 of the substrate 10. The integrated circuit die and inner cavity are typically sealed with a lid (not shown) that is mounted to the substrate 10. The substrate 10 has a plurality of inner surface pads 14 arranged in a rectangular pattern about a integrated circuit mount portion 16 of the substrate 10. The inner surface pads 14 are coupled to outer leads/pin (not shown) of the package by conductive traces and vias within the substrate 10. The outer leads/pins are located on the outer bottom surface of the substrate 10. The outer leads/pins are typically soldered/inserted to corresponding conductive holes or pads of a printed circuit board to couple the substrate and IC to the board.

In the preferred embodiment, the inner surface pads 14 are located in 4 different groups arranged in a rectangular pattern about the mount portion of the substrate 10. A substantial portion of the pads are oriented at an angle relative to the center pads of each pad grouping. In the preferred embodiment, the substrate 10 is constructed from a ceramic material. To form the substrate 10, the surface pads 14 and other conductors are located on uncured ceramic material. The uncured ceramic and conductors are then fired to create a hard ceramic substrate. The heating and subsequent cooling of the substrate causes the ceramic and conductors to expand and contract.

Figure 4:
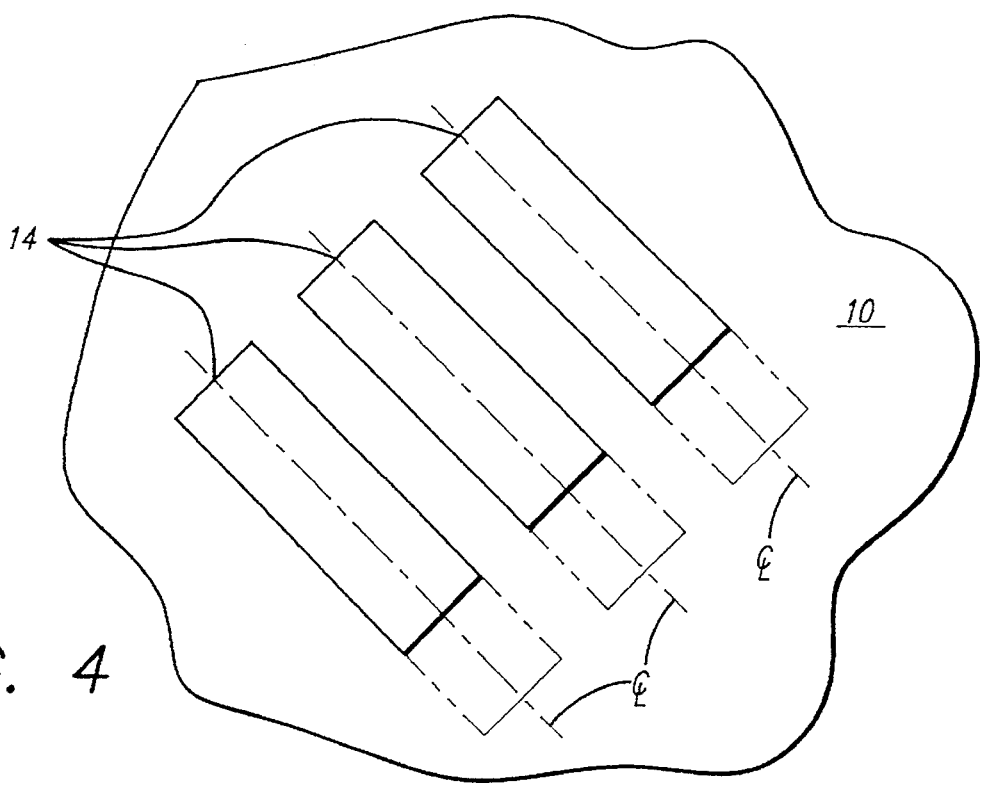
FIG. 4 is a top view showing the expansion of inner surface pads on the substrate of FIG. 3.

As shown in FIG. 4, the inner surface pads 14 and underlying ceramic expand and contract along the longitudinal axis of the pads 14. The longitudinal expansion and contraction of the ceramic and inner surface pads 14 prevent any significant lateral movement of the pads 14 relative to the substrate, thereby providing surface pad 14 locations which are more accurate and predictable.

Figure 5:
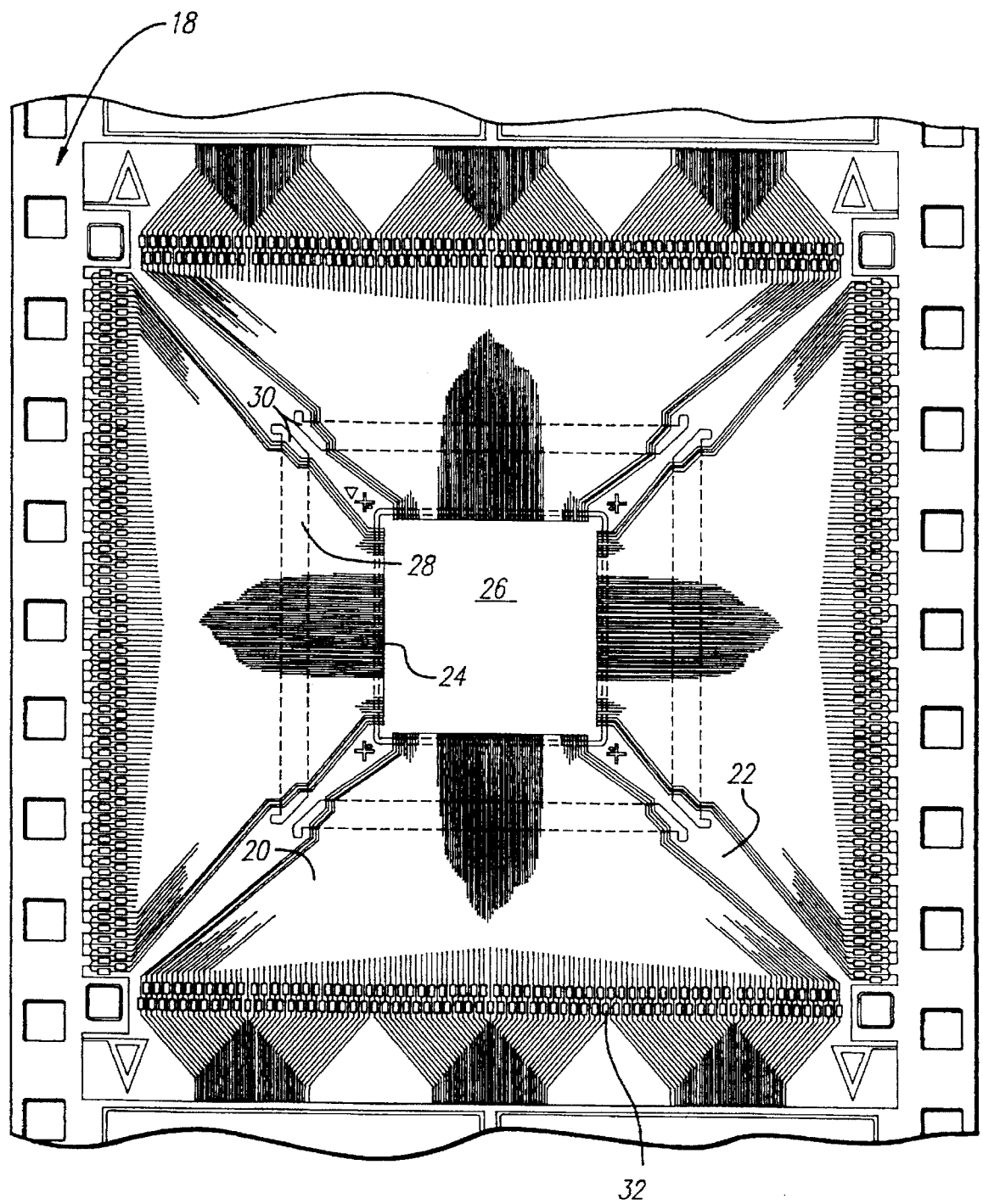
FIG. 5 is a top view of a TAB tape that couples an integrated circuit to the substrate shown in FIG. 3.

FIG. 5 shows a TAB (tape automated bonding) tape 18 that couples an integrated circuit to the substrate 10. The tape 18 has a plurality of conductive traces 20 attached to a dielectric tape 22. The conductive traces 20 each have a first end 24 that extends into an integrated circuit opening 26 in the tape 22. The conductive traces 20 also each have a land portion 28 that is subsequently attached to the inner surface pads 14 of the substrate 10. The land portions 28 are arranged in a rectangular pattern about the integrated circuit opening 26 that corresponds to the pattern of the inner surface pads 14. Like the substrate, the tape 18 has a substantial portion of land portions oriented at an angle relative to the center land portions of the land portion groupings.

The land portions 28 of the conductive traces 20 are exposed by windows 30 in the tape 22. The windows 30 and conductive traces 20 are typically constructed to create 4 groups of land portions 28 located in a rectangular pattern that corresponds to the rectangular pattern of the inner surface pads 14. The conductive traces 20 also extend out to test pads 32 located at the outer edges of the tape 18. The integrated circuit may be tested through the test pads 32 before the IC die is mounted to the substrate 10.

Figure 6:
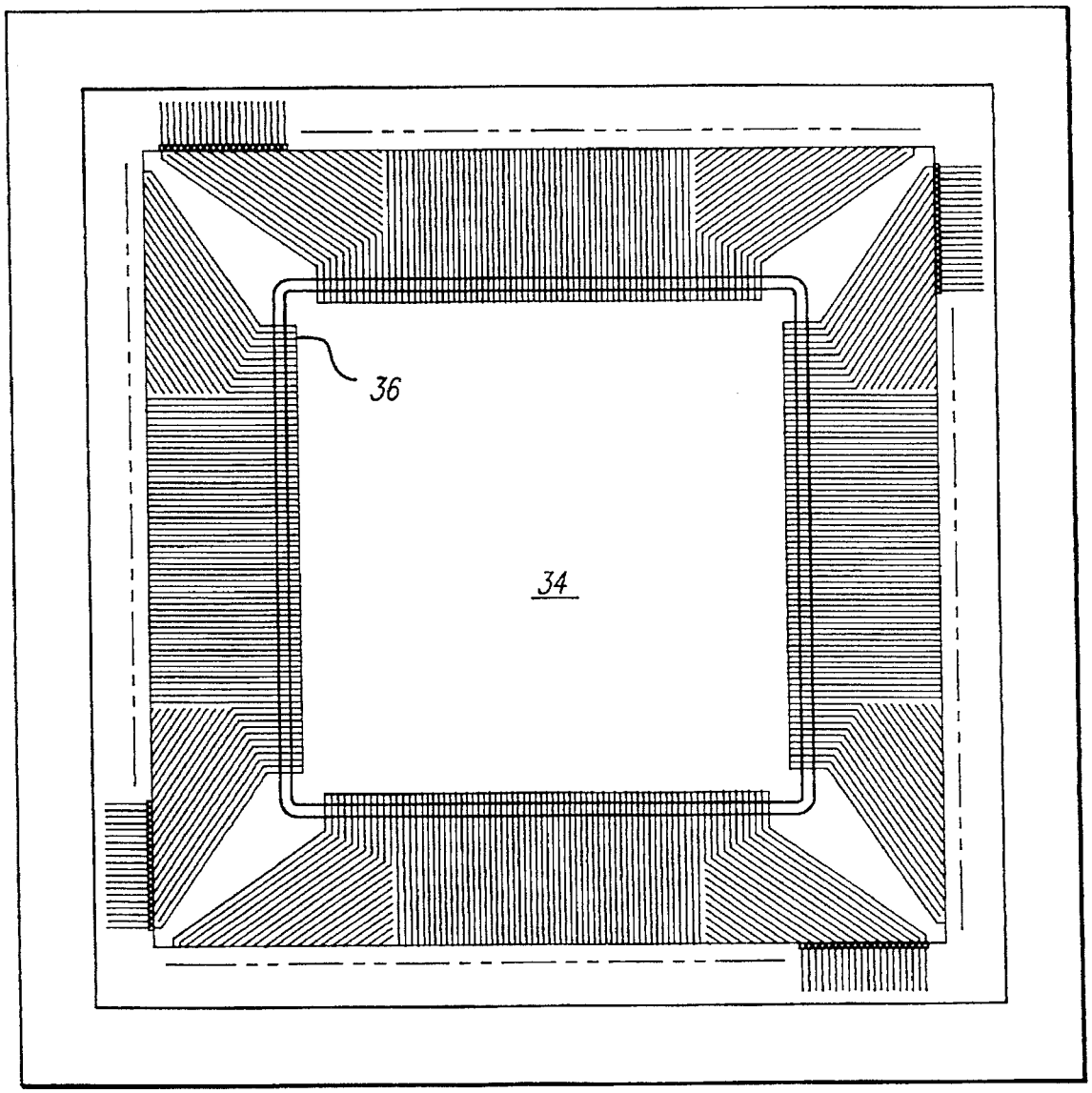
FIG. 6 is a top view showing an integrated circuit mounted and coupled to the substrate by the TAB tape.

FIG. 6 shows an integrated circuit die 34 mounted to the substrate 10 and coupled to the inner surface pads 14 by the TAB tape 18. The die 34 has a plurality of outer surface pads 36 which provide the output pins for the integrated circuit.

To mount the die 34 to the substrate 10, the first ends 24 of the conductive traces 20 are initially bonded to the outer surface pads 36 of the integrated circuit. The integrated circuit 34 may then be tested through the test pads 32 of the tape 18. The test pads are then cut off from the tape. The die 34 is mounted to the mount portion 16 of the substrate 10, typically with an adhesive. A heat sink may also be attached to the die to improve the thermal performance of the package. The land portions 28 of the tape 18 are then aligned with and attached to the inner surface pads 14. The land portions 28 are typically attached to the inner surface pads 14 by the application of heat and ultrasonic pressure.

Any subsequent thermal cycling of the package will cause an expansion of the surface pads 14 and underlying ceramic along the longitudinal axis of the pads 14. The longitudinal expansion of the pads 14 reduces the stresses on the bond joints and the conductive traces 20.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. An integrated circuit package, comprising:

a substrate which has an integrated circuit mount portion that has a center point and a plurality of inner surface pads located in a rectangular pattern about said integrated circuit mount portion wherein at least one of said inner surface pads are oriented at an oblique angle relative to another one of said inner surface pads;

a rectangular integrated circuit mounted to said integrated circuit mount portion of said substrate, said integrated circuit having a plurality of adjacent edges and a plurality of outer surface pads; and, a dielectric tape which has a plurality of conductive leads that each have a first end attached to said outer surface pads, each conductive lead also having a land portion attached to said inner surface pads of said substrate wherein at least one land portion has a segment that is perpendicular to an edge of said integrated circuit and a segment that is oriented at an oblique angle relative to said edge of said integrated circuit, each said land portion having a longitudinal axis that extends through the center point, wherein said attached oblique land portions each have an attached area that is oriented at an oblique angle relative to said edge of said integrated circuit.

2. The package as recited in claim 1, wherein said land portions are exposed by a plurality of windows in said dielectric tape.

3. The package as recited in claim 2, wherein said windows are arranged in a rectangular pattern about said integrated circuit.

* * * * *